United States Patent
Groover et al.

(10) Patent No.: US 7,233,154 B2
(45) Date of Patent: Jun. 19, 2007

(54) PROXIMITY SENSOR

(75) Inventors: Thomas A. Groover, Houston, TX (US); King L. Poon, Missouri City, TX (US)

(73) Assignee: Thermo Fisher Scientific Inc., Sugar Land, TX (US)

( * ) Notice: Subject to any disclaimer, the term of this patent is extended or adjusted under 35 U.S.C. 154(b) by 0 days.

(21) Appl. No.: 11/102,141

(22) Filed: Apr. 8, 2005

(65) Prior Publication Data

US 2005/0179447 A1  Aug. 18, 2005

Related U.S. Application Data

(63) Continuation-in-part of application No. 10/284,628, filed on Oct. 31, 2002, now abandoned.

(60) Provisional application No. 60/335,982, filed on Nov. 1, 2001.

(51) Int. Cl.
*G01R 27/62* (2006.01)
(52) U.S. Cl. ........................... 324/662; 324/671
(58) Field of Classification Search ............... 324/662, 324/515, 699, 696, 67; 29/832; 73/855, 73/431
See application file for complete search history.

(56) References Cited

U.S. PATENT DOCUMENTS

| | | | | |
|---|---|---|---|---|
| 4,099,118 A | * | 7/1978 | Franklin et al. | 324/671 |
| 4,760,326 A | * | 7/1988 | Bird | 324/690 |
| 4,887,469 A | * | 12/1989 | Shoptaw | 73/861.77 |
| 5,062,711 A | * | 11/1991 | Brown et al. | 356/394 |
| 5,851,108 A | * | 12/1998 | Clymer et al. | 417/44.1 |
| 6,118,283 A | * | 9/2000 | Cripe | 324/660 |
| 6,894,510 B2 | * | 5/2005 | Schmidt et al. | 324/690 |

FOREIGN PATENT DOCUMENTS

GB    2197075 A  *  5/1988

* cited by examiner

*Primary Examiner*—Anjan Deb
(74) *Attorney, Agent, or Firm*—Osha Liang LLP

(57) ABSTRACT

A proximity sensor module includes a housing; and a proximity sensor disposed in the housing, wherein the proximity sensor comprises a sensor plate configured to contact inside of the housing such that substantially no gap exists between the sensor plate and the housing. The housing may be a substantially explosion-proof housing. The housing may include two members coupled by a thread engagement, wherein a sensor plate of the proximity sensor is placed off-center with respect to an axis of rotation for the thread engagement.

7 Claims, 4 Drawing Sheets

PROXIMITY SENSOR

CROSS-REFERENCE TO RELATED APPLICATIONS

This is a continuation-in-part (CIP) application of U.S. application Ser. No. 10/284,628, filed on Oct. 31, 2002, now abandoned which claims the benefit of Provisional Application No. 60/335,982, filed on Nov. 1, 2001. The present application claims the benefits of both the Ser. No. 10/284,628 and 60/335,982 applications, which are incorporated by reference in their entireties.

BACKGROUND OF INVENTION

1. Field of the Invention

The present invention relates generally to communication and control systems for use in monitoring and controlling various systems and equipment in industrial environments.

2. Background Art

At locations where oil and gas are produced, a number of flammable gases may be present, including mixtures of oxygen, methane, ethane, propane, hydrogen sulfide and others. Similar potentially dangerous environmental conditions exist in locations in which petroleum products are being recovered, refined or processed. Likewise, in industrial areas where large quantities of dust are present, such as in grain handling facilities or pulp and paper mills, hazardous environmental conditions may exist. Standardized classifications for the various types of hazardous locations have been adopted and assigned by regulatory agencies according to the nature and type of hazard that is generally present or that may occasionally be present.

Because electrical components, by their nature, may generate heat and sparks sufficient to ignite a flammable gas or other flammable mixture under even normal operating conditions, such components must be carefully selected and installed when used in an area that is classified as hazardous. More specifically, the components must exceed certain minimum standards as to such characteristics as power consumption, operating temperature, current and voltage requirements, and energy storage capabilities. These standards are also established by regulatory authorities and vary depending upon the particular hazardous environment.

Certain electrical devices are intrinsically safe. An intrinsically safe device may be generally described as a device that during normal operation, as well as operation during any fault condition, cannot cause a spark or achieve a temperature sufficient to ignite the gas or other substance that is present and that causes the area to be classified. If a device is not intrinsically safe, other means must be provided to ensure that the device cannot serve as a source of ignition. Typically where a device is not intrinsically safe, it may be made safe by housing it in an explosion-proof enclosure or housing. An explosion-proof housing or enclosure, as that term is used herein, means an enclosure that prevents any spark or explosion within the enclosure from causing the atmosphere outside the housing to ignite.

Although areas that are classified as hazardous are prevalent in many industries, the problems of powering and communicating with electrical devices in hazardous areas are particularly acute in the production, gathering, distribution and transportation of oil and gas. Many of the areas around an oil and gas production site are classified as hazardous, and thus special precautions are required with respect to the electrical communication and power distribution systems. To efficiently and safely control the operation, a system having sensors positioned in a number of locations in the hazardous area is often required. These sensors will transmit needed data to a computer which can process that data and transmit important information to the operator by means of a console or monitor. By viewing the information on the monitor, the operator can then make whatever changes that are appropriate to the system to assure safe and efficient operation.

The monitor is typically required to be very close to the well head and thus is located in a hazardous area. Historically, such consoles have varied with respect to the amount of information displayed and type of indicators used. In the past, when a simple meter or gage provided all the information that was required, the device could sometimes be made intrinsically safe. However, due to the sophistication of today's oil and gas production operations, consoles or monitors usually provide an operator with a tremendous amount of information. Additionally, the console may permit the operator to issue commands or make inquiries through the use of a keyboard or key pad, and may display all the needed information by means of an LCD or other display. These modern consoles or monitors typically have a substantial power requirement that has prevented them from being made intrinsically safe, and often requires that they be housed in an explosion proof enclosure.

In oil and gas production operations, various sensors, consoles and monitors are used in remote areas where running power lines is difficult. Thus, it is often desirable to power such units with solar power or batteries. Because such power sources have limited capacities, it would be advantageous to develop low power consumption components for these units.

Another approach to increasing the working life of a power source is to shut down non-essential units when not in use, and run components only to the extent necessary to perform desired functions (e.g. running a microprocessor at a lower clock speed or turning off a display when not in use). However, this task is made difficult in a hazardous area because methods of regulating power to the system, and configuring operating ranges of components, are limited. For instance, a typical toggle switch cannot be used in such an area, due to its electrical characteristics. Therefore, it would be advantageous to develop a power control system that may be used safely in a hazardous area, so that electrical components (e.g., a visual display, microprocessor, or infrared data link) can be regulated to consume minimal power. This avoids unnecessary consumption of power.

SUMMARY OF INVENTION

One aspect of the invention relates to proximity sensor modules. A module in accordance with one embodiment of the invention includes a housing; and a proximity sensor disposed in the housing, wherein the proximity sensor comprises a sensor plate configured to contact inside of the housing such that substantially no gap exists between the sensor plate and the housing.

Another aspect of the invention relates to methods for assembling a proximity sensor module that includes a housing and a proximity sensor, wherein the housing comprises a first housing member and a second housing member, wherein the first housing member is configured to coupled to the second housing member by a thread engagement. A method for assembling a proximity sensor module in accordance with one embodiment of the invention includes disposing the proximity sensor in the first housing member or the second housing member; and coupling the first housing member and the second housing member to make up the housing, wherein the coupling is accomplished by rotating the first housing member relative to the second housing member to form the thread engagement, wherein a sensor plate of the proximity sensor is placed off-center with respect to an axis of rotation for the thread engagement, wherein the sensor plate contacts the first housing member when the first housing member is coupled to the second housing member.

Other aspects and advantages of the invention will be apparent from the following description and the appended claims.

DETAILED DESCRIPTION

Embodiments of the invention relate to proximity sensors that may be used in hazardous environments. Proximity sensors can detect the presence or absence of a target without directly contacting the target. Therefore, proximity sensors may be enclosed in an explosion-proof or explosion-resistant housing, if necessary. "Explosion-resistant" as used in this description means substantially explosion proof. One of ordinary skill in the art would appreciate that "explosion proof" suggests an article meets certain safety guidelines, which may be set by a regulatory agency or certifying agency. Safety regulations often dictate the types of materials and thickness of the wall of a housing of an explosion-proof or explosion-resistant enclosure. For example, if a glass window is to be used, a minimum thickness (e.g., ⅜", 0.95 cm) may be required. The minimum thickness requirement of the housing may significantly degrade the sensitivities of the sensors, which often have limited operational ranges (e.g., a couple centimeters or less) for reliable detection. Power consumption constraint, as noted above, may also limit the sensitivity range of a sensor.

Some proximity sensors of the invention are designed to have good sensitivity and/or low power consumption (e.g., a few milliwatts). Some embodiments of the invention are designed to minimize the distance between a sensor plate of the proximity sensor and an object to be detected, for example by urging the sensor plate against a wall (or window) of the housing to minimize or remove any gap that may exists between the sensor plate and the housing. Furthermore, some embodiments of the invention may be designed for easy repair of the sensor module with minimum distortion to a sensor plate.

Common proximity sensors may be based on optical sensors, inductive sensors, or capacitive sensors. These proximity sensors are often used in a dusty environment, which renders optical sensors less desirable. Inductive proximity sensors are sensitive and reliable for detecting metal objects, but they are insensitive for non-metallic objects. Capacitive sensors can detect metallic or non-metallic objects. However, for the detection of metallic objects, capacitive sensors are typically less reliable and more expensive than inductive sensors. In accordance with embodiments of the invention, a proximity sensor (including a capacity type proximity sensor) may be made more sensitive and more reliable by urging the sensor plate to contact the wall (or a window) of the housing.

Figure 1:
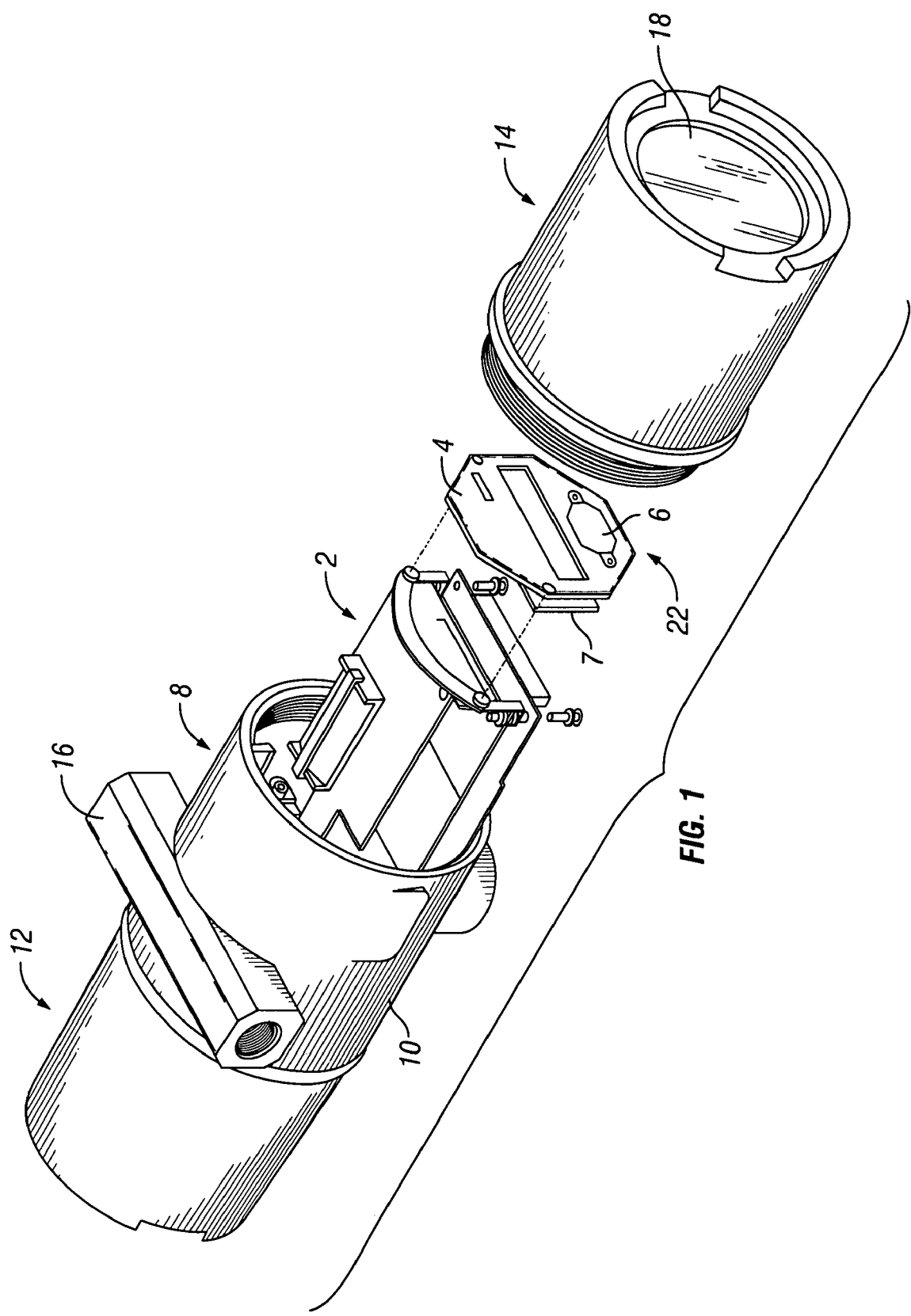
FIG. 1 shows one embodiment of an explosion-proof module with proximity sensor.

FIG. 1 is a partial schematic view of a sealable proximity sensor module ("module") according to one embodiment of the invention. The module includes a proximity sensor 22, comprising an interface board 4 and a sensor plate 6. The proximity sensor 22 may be of any type known in the art, including, but not limited to, capacitive and resistive proximity sensors. A housing 8 may consist of a single member or may comprise any number of separate housing members. In one embodiment, these housing members include a mounting cover 10, rear housing cover 12, and front housing cover 14. The multiple pieces of the housing members may be coupled with any mechanisms known in the art, such as thread engagement, latches or clamps.

A housing member may include one or more interfaces for connecting external components, or for the ingress or egress of various conduits, such as cables and hoses. For example, the embodiment shown in FIG. 1 includes an antenna interface 16. The antenna interface 16 may include threads, to accommodate a threaded antenna component (not shown). Because of the desire to use various components with the module, based on a particular job, location, or other parameters, it should be understood that an interface on the module may vary widely both in its configuration and location on the module. Furthermore, in one or more embodiments, the housing of the proximity sensor module may be substantially explosion-proof or explosion-resistant.

The housing members of the housing 8 may be assembled (made up) in any fashion known in the art to meet the applicable standards for the environment in which the module will be used. In one embodiment, assembly of the housing 8 may be performed without any special tools or devices, through the use of mating threads on the housing members, or other fastening devices (e.g., latches or clamps) known in the art. Furthermore, in accordance with one embodiment of the invention, the housing 8 may include one or more transparent members 18. A "transparent member" as used herein refers to a member (e.g., a window) that does not interfere with the mechanism of operation of the proximity sensor, i.e. transparent to the energy used in the detection mechanism. The transparent member may be an integral part of the housing wall or a separate part attached to the housing wall. The transparent member 18 may comprise any suitable material known in the art, such as glass and plastic. For an optical sensor, this should have sufficient transparency to the light. For a capacitive proximity sensor, the transparent member should preferably not have a high dielectric constant to degrade the sensitivity. Likewise, for an inductive proximity sensor, the transparent member is preferably not made of a metallic material. In some embodiments of the invention, the entire housing 8, or a housing member (shown as 10, 12, 14 in FIG. 1), may comprise a transparent material. In this case, the "transparent member" may correspond to the entire housing member or a portion of the housing member.

Referring again to FIG. 1, electrical components 2 are disposed within the housing 8. The nature and configuration of the electrical components 2 will vary widely based on the purpose of the particular module and other considerations, and may include any suitable electrical components known in the art. In one embodiment, such electrical components 2 may comprise a measurement computer. In the embodiment shown, electrical components 2 may include one or more displays 7.

Figure 2:
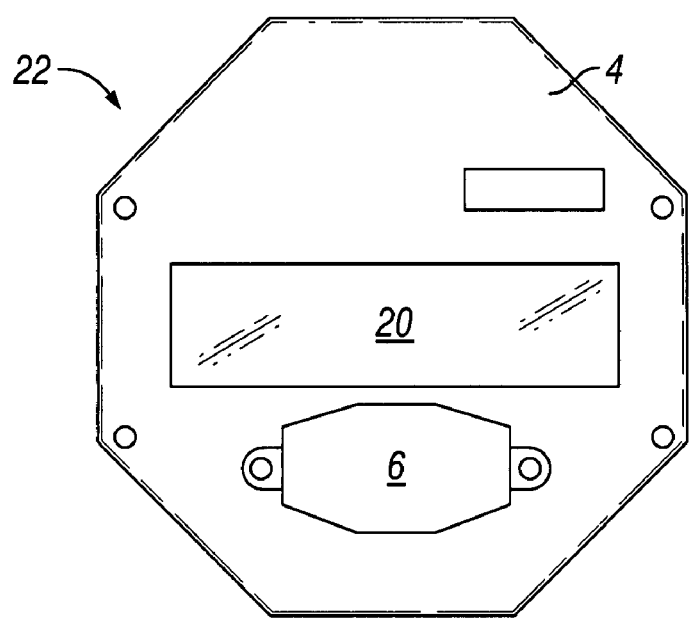
FIG. 2 shows a sensor plate mounted on an interface board, according to one embodiment of the invention.

One or more proximity sensors 22 may be disposed within the housing 8 and operatively connected to the electrical components 2. Referring to FIG. 2, a proximity sensor 22 may include an interface board 4 and sensor plate 6. For a capacitive proximity sensor, the sensor plate 6 functions as a capacitor plate. For an inductive proximity sensor, the sensor plate 6 may include one or more coils or conductor wire loops for generating or sensing magnetic fields. In accordance with embodiments of the invention, the sensor plate 6 is operatively connected to the interface board 4 such that the sensor plate 6 will be proximate (or contact) a wall of a housing member or a transparent member on a housing member.

Figure 3:
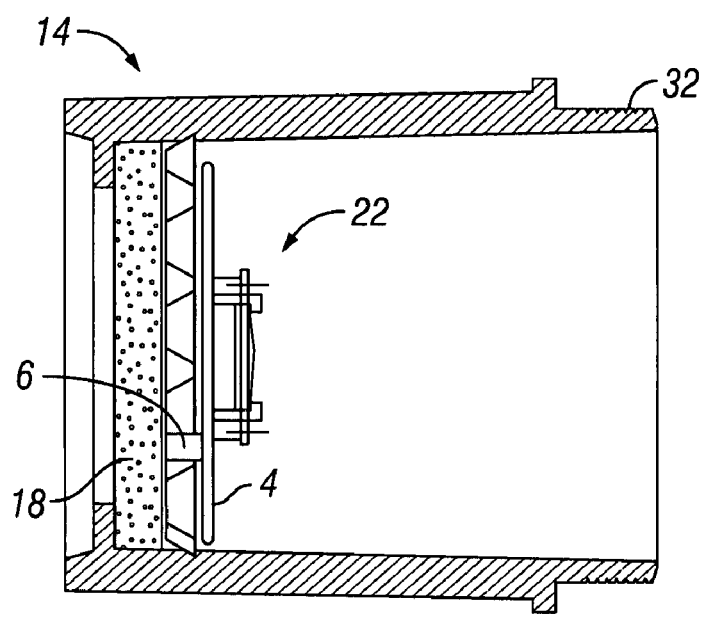
FIG. 3 demonstrates the disposition of a proximity sensor within a front housing cover, according to one embodiment of the invention.

Referring to FIG. 3, which is a sideway cross sectional view of a proximity sensor module of the invention. As shown in FIG. 3, the sensor plate 6 is proximate a transparent member 18. In some embodiments, the sensor plate 6 may be urged to contact a transparent member 18 such that there is no gap between the sensor plate 6 and the transparent member 18 (or the wall of the housing 8) in order to minimize the distance to the target.

Because the housing members (shown as 10, 12, 14 in FIG. 1) of the housing 8 may interconnect in various ways, it is advantageous to provide a proximity sensor 22 having a sensitivity that will not be diminished by various methods of interconnection. Particularly, in embodiments where the sensor plate 6 may contact the transparent member 18, or is compressed by the transparent member 18, it is desirable that the sensitivity of the sensor plate 6 is not diminished by deformation or other effects of the movement of the transparent member 18.

FIG. 2 illustrates an interface board 4, according to one embodiment of the invention. A window 20 may be provided in the interface board 4 to permit viewing of data on a display (shown as 7 in FIG. 1) located behind the interface board 4. Alternatively, a display may be integrated into the interface board 4. The sensor plate 6 is operatively connected to the interface board 4 such that it preferably does not obscure the window 20 or extend beyond the periphery of the interface board 4. In such embodiments, the transparent member (shown as 18 in FIG. 1) may pass lights (e.g., made of glass or plastic) such that a user can see the display 7 inside the module.

FIG. 3 shows the location of the interface board 4 and sensor plate 6 within a housing member 14, according to one embodiment of the invention. The proximity sensor 22 is positioned proximal a transparent member 18, such that the sensor plate 6 is in close proximity to, or in contact with, the transparent member 18. The proximity sensor 22 is operatively connected to one or more electrical components (shown as 2 in FIG. 1). During assembly or reassembly of the module, the front housing cover 14 will be coupled to another housing member (e.g., 10 shown in FIG. 1) of the housing 8 (shown in FIG. 1) by threads 32 or other coupling mechanisms known in the art (e.g., latches or clamps). As the front housing member 14 comes to rest, the transparent member 18 of the front housing member 14 will be in close proximity to (or in contact with) the sensor plate 6. In one embodiment, coupling of the front housing cover 14 with another housing member (e.g., 10 in FIG. 1) will cause compression of the sensor plate 6 of the proximity sensor 22.

Compression of the sensor plate 6 will increase the sensitivity of the proximity sensor 22 by increasing the contact area with the transparent member 18 and decreasing the distance between the sensor plate 6 and a target (e.g. an operator's finger). Furthermore, the increased contact area and decreased distance achieved by compression of the sensor plate 6 will decrease the current required to operate the proximity sensor 22 at a desired sensitivity.

FIG. 3 shows an example where the proximity sensor 22 is located inside the front housing member 14. One of ordinary skill in the art would appreciate that the proximity sensor 22 may also be located anywhere in the housing 8. In some embodiments, multiple proximity sensors 22 may be included in the module. In other embodiments, multiple sensor plates 6 may operatively connect to a single interface board 4. Where multiple sensor plates 6 or multiple proximity sensors 22 are used, more advanced interaction with the electrical components 2 of the module is possible. For instance, the use of multiple sensor plates 6 or proximity sensors 22 may provide a functionality similar to that of a keyboard, mouse, or any other input device known in the art.

Figure 4:
FIG. 4 is a side view of a sensor plate according to one embodiment of the invention.

FIG. 4 is a side view of one embodiment of a sensor plate 6. In this embodiment, the sensor plate 6 is a one-piece conductive member. Alternatively, the sensor plate 6 may comprise multiple conductive members. In one or more embodiments, the conductive member comprises a stainless spring steel alloy. In one embodiment, the sensor plate 6 may be configured to press against the transparent member 18 (see FIG. 3). Accordingly, one or more legs 24 of the sensor plate 6 are non-linear to permit compression. In one or more embodiments, the leg 24 may have one or more bends to provide a spring mechanism that can urge the sensor plate 6 to contact the transparent member 18 (or a wall of the housing). A top plate 26 of the sensor plate 6 may be substantially flat (as shown) or may be slightly curved so that a compression of the sensor plate 6 will decrease the curvature and make tight contact with the transparent member 18. At least one leg 24 terminates in a relatively flat mounting tab 28. The mounting tab 28 can be operatively connected to an interface board (shown as 4 in FIG. 2) or other electrical component.

Figure 5:
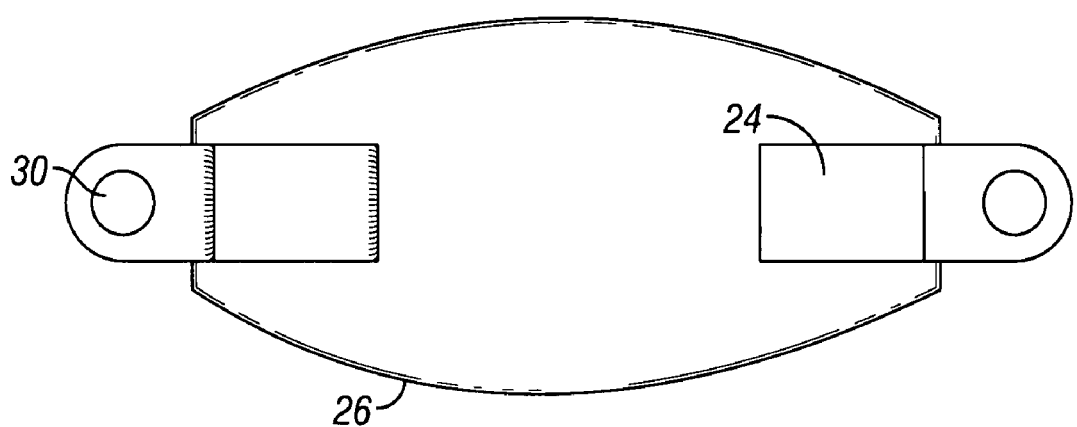
FIG. 5 is a bottom view of a sensor plate according to one embodiment of the invention.

FIG. 5 is a bottom view of a sensor plate 6 according to one embodiment of the invention. The top plate 26 may have a shape with curved edges (as shown) or may be of any desired shape. A top plate with a shape having an increased surface area (e.g., with the curved edges shown in FIG. 5) is advantageous because it may increase the sensitivity of the sensor. The mounting tabs 28 of one or more legs 24 may contain one or more holes 30 for connecting to an interface board 4. However, it is not necessary to use holes 30 for connecting the sensor plate 6 to an interface board 4 or other component. Connections may be of any type known in the art, such as soldering.

The structure of the sensor plate 6 (including legs 24) advantageously allows it withstand various forces, including compression and twisting forces that may be exerted on the sensor plate 6 during assembling or disassembling of housing members, without adversely impacting the functionality of the sensor plate 6. Furthermore, the sensor plate 6 preferably do not bind (or stick to) the housing members as they are moved and/or rotated during assembly. Therefore, the relative position of the sensor plate 6 to the transparent member 18 or the window 20 (FIG. 2) should not be distorted as the module is assembled. The leg 24 has a resistance to significant motion, while providing a spring-type mount. Bowing of the sensor plate 6, that may occur during compression, may advantageously increase the contact between the sensor plate 6 and the transparent member 18, thereby increasing sensitivity and/or decreasing power consumption. These aspects are further described with reference to FIGS. 6A–6C.

Figure 6A:
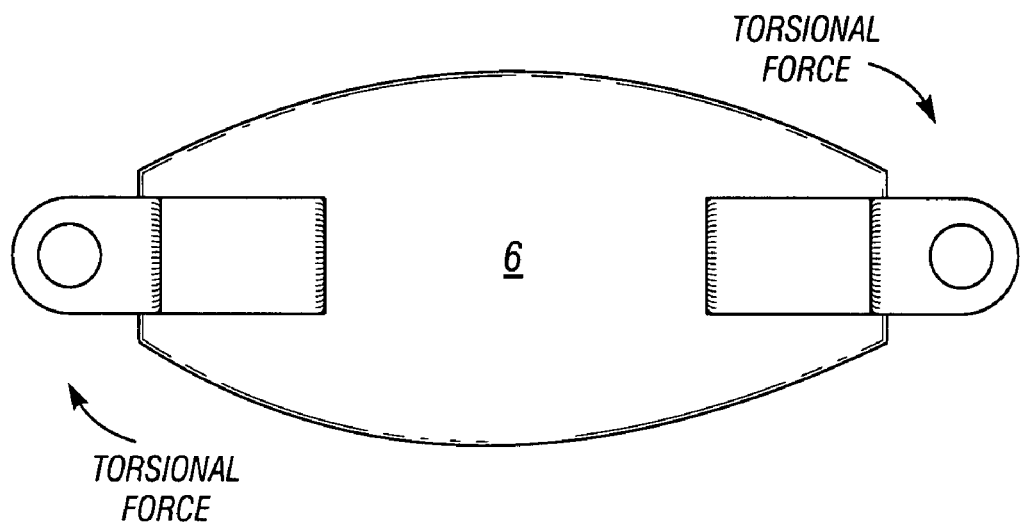
FIGS. 6A –6C illustrate various forces exerting on a sensor plate of the invention during assembly and disassembly of the module.

FIG. 6A illustrates torsional forces that may be exerted on the sensor plate 6 when screwing in (or out) the front cover (14 in FIG. 1) of the module. The structure of the sensor plate 6 should be relatively resistant to such torsional twisting. Furthermore, such torsional forces may be converted into lateral forces, if the sensor plate is placed off-center with respect to the axis of rotation of the front housing member (shown as 14 in FIG. 1) of the module. This aspect of the invention will be described in detail with reference to FIG. 7.

Figure 6B:
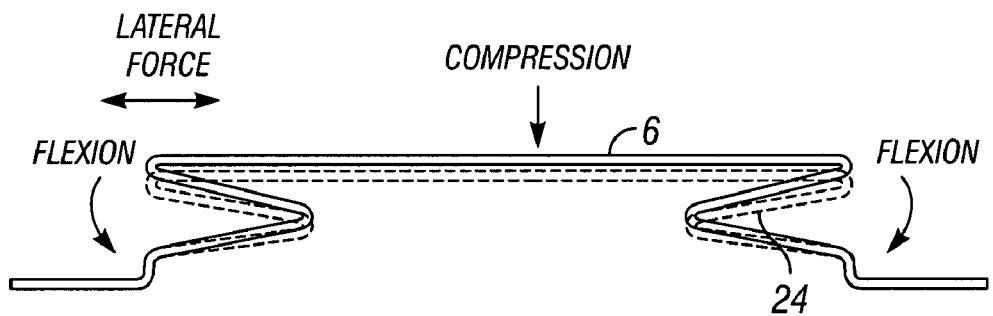

FIG. 6B shows the lateral forces, compressional forces, and flexion forces that may be exerted on the sensor plate 6 during the assembly or disassembly of the front housing member (shown as 14 in FIG. 1) of the module. The compression force presses down on the sensor plate 6 to bend the legs 24 and force the sensor plate 6 to adopt a low profile (shown as the dotted line profile). The flexion forces will push one end or the other of the sensor plate 6 lower, while the lateral forces may push the sensor plate 6 to one end. However, the spring mechanism of the legs 24 can store the energy and ensure that the sensor plate 6 is always in close contact with the housing (e.g., the transparent member 18 in FIG. 1) to minimize the distance to the target.

Figure 6C:
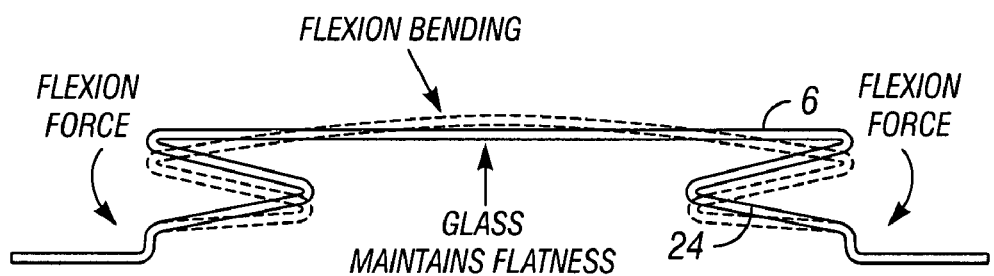

FIG. 6C shows that flexion forces might result in flexion bending. The flexion bending will cause the sensor plate 6 to curve up at the center, as shown in the dotted line profile. When the sensor plate 6 is pressed against the housing (e.g., the transparent member 18 in FIG. 1), the sensor plate 6 will be forced to adopt a flat profile (shown in the solid line profile). As a result, there will be maximum contact between the entire sensor plate 6 and the transparent member (not shown). This will maximize the sensitivity of the sensor plate 6. Note that the shape of the spring legs 24 shown in the above embodiment is for illustration only. One of ordinary skill in the art would appreciate that other modifications are possible without departing from the scope of the invention.

Figure 7:
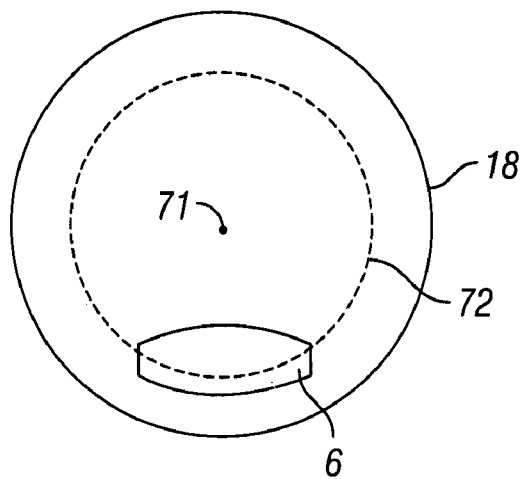
FIG. 7 illustrates an off-centered placement of a sensor plate in accordance with one embodiment of the invention.

As noted above with reference to FIG. 6A, the torsional forces exerted on the sensor plate 6 may be converted into mostly lateral forces if the sensor plate 6 is placed off-centered with respect to the axis of rotation. FIG. 7 illustrates one embodiment of the invention, in which the sensor plate 6 of a proximity sensor is placed off-centered with respect to the axis of rotation 71 of the front housing member (shown as 14 in FIG. 1). As shown in FIG. 7, the sensor plate 6 is pressed against the transparent member 18. When the transparent member, together with the front cover (not shown), is rotated during assembly or disassembly of the module, the sensor plate 6 will trace a circular path 72 on the transparent member 18. The off-centered placement of the sensor plate 6 (or the proximity sensor) with respect to the axis of rotation 71 may be advantageous in some embodiments of the invention because the flexible legs (shown as 24 in FIG. 4) may be more resistant to lateral forces. One of ordinary skill in the art would appreciate that such advantages would be realized if rotation is involved in the assembly or disassembly of the module. However, if embodiments of the invention involve other types of mechanism for assembly, such as latches or clamps, then the off-centered placement may not confer such advantages.

The advantages of embodiments of the invention are numerous. A proximity sensor of the invention may be designed to have high sensitivity and consume minimum power. Proximity sensors of the invention may be used in environments where explosions and other hazards may occur. In some embodiments, the sensor may be configured to facilitate easy assembly and disassembly of the housing member without significantly impacting the sensitivity of the sensors. The compressibility and positioning of the legs may impart a bending tendency to the sensor plate that desirably enhances contact between the sensor plate and the glass plate or transparent member. The compressibility of the bent legs or other flexible member also increases resistance of the sensor plate to distortion.

While the invention has been described with respect to a limited number of embodiments, those skilled in the art, having benefit of this disclosure, will appreciate that other embodiments can be devised that do not depart from the scope of the invention as disclosed herein. Accordingly, the scope of the invention should be limited only by the attached claims.

What is claimed is:

1. A sensor module comprising:
   a housing, wherein the housing comprises a first housing member and a second housing member, wherein the first housing member is coupled to the second housing member by thread engagement; and
   a proximity sensor disposed in the housing, wherein the proximity sensor comprises a sensor plate configured to contact inside of the housing such that substantially no gap exists between the sensor plate and the housing.

2. The sensor module of claim 1, wherein the sensor plate is positioned off-center with respect to an axis of rotation for the thread engagement.

3. The sensor module of claim 2, wherein the housing is explosion-resistant.

4. The sensor module of claim 3, wherein the sensor plate contacts a transparent member on the housing.

5. The sensor module of claim 4, wherein the transparent member is made of glass or plastic.

6. The sensor module of claim 5, wherein the transparent member is made of glass having a thickness of about ⅜" (0.95 cm).

7. A method for assembling a proximity sensor module comprising a housing and a proximity sensor, wherein the housing comprises a first housing member and a second housing member, wherein the first housing member is configured to coupled to the second housing member by a thread engagement, the method comprising:
   disposing the proximity sensor m the first housing member or the second housing member; and
   coupling the first housing member and the second housing member to make up the housing, wherein the coupling is accomplished by rotating the first housing member relative to the second housing member to form the thread engagement, wherein a sensor plate of the proximity sensor is placed off-centered with respect to an axis of rotation for the thread engagement, wherein the sensor plate contacts the first housing member when the first housing member is coupled to the second housing member.

* * * * *